(12) United States Patent
Achehboune et al.

(10) Patent No.: US 10,735,868 B2
(45) Date of Patent: Aug. 4, 2020

(54) MEMS PACKAGING

(71) Applicant: Cirrus Logic International Semiconductor Ltd., Edinburgh (GB)

(72) Inventors: Rkia Achehboune, Edinburgh (GB); Dimitris Drogoudis, Edinburgh (GB); Roberto Brioschi, Austin, TX (US); Aleksey Sergeyevich Khenkin, Nashua, NH (US); David Patten, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/179,237

(22) Filed: Nov. 2, 2018

(65) Prior Publication Data

US 2019/0158962 A1 May 23, 2019

Related U.S. Application Data

(60) Provisional application No. 62/587,621, filed on Nov. 17, 2017.

(30) Foreign Application Priority Data

Dec. 1, 2017 (GB) .................................. 1720085.8

(51) Int. Cl.
*H04R 19/04* (2006.01)
*B81B 7/02* (2006.01)
(Continued)

(52) U.S. Cl.
CPC .............. *H04R 19/04* (2013.01); *B81B 7/02* (2013.01); *H04R 1/04* (2013.01); *H04R 19/005* (2013.01);
(Continued)

(58) Field of Classification Search
CPC ...... H04R 19/04; H04R 19/01; H04R 19/005; H04R 19/013; H04R 1/04; H04R 21/00;
(Continued)

(56) References Cited

U.S. PATENT DOCUMENTS 3,414,667 A * 12/1968 Tanner ................. H04N 5/2283
348/327
5,015,975 A *  5/1991 Okubo ..................... H03H 7/06
333/181
(Continued)

FOREIGN PATENT DOCUMENTS

EP    2751818 A2    7/2013
GB    2528872 A     2/2016
(Continued)

OTHER PUBLICATIONS

Combined Search and Examination Report under Sections 17 and 18(3), UKIPO, Application No. 1720085.8, dated Apr. 25, 2018.
(Continued)

*Primary Examiner* — Fan S Tsang
*Assistant Examiner* — Angelica M Mckinney
(74) *Attorney, Agent, or Firm* — Jackson Walker L.L.P.

(57) ABSTRACT

A package for a MEMS device, the package comprising a MEMS transducer within a chamber of the package; and a package substrate, wherein an upper surface of the package substrate defines at least part of a surface of the chamber; wherein the package substrate comprises a plurality of metal layers, the package substrate further comprising at least a part of a filter circuit for filtering RF signals, wherein a first metal layer is provided in a first plane of the substrate and wherein a resistor of the filter circuit is provided in a plane below the first plane.

15 Claims, 6 Drawing Sheets

(51) Int. Cl.
 *H04R 1/04* (2006.01)
 *H04R 19/00* (2006.01)
(52) U.S. Cl.
 CPC ............... *B81B 2201/0257* (2013.01); *H04R 2201/003* (2013.01)
(58) Field of Classification Search
 CPC .... H04R 23/00; H04R 2201/003; B81B 7/04; B81B 2201/0257
 See application file for complete search history.

(56) References Cited

U.S. PATENT DOCUMENTS

| | | | | |
|---|---|---|---|---|
| 6,253,359 B1* | 6/2001 | Cano | ................... | G06F 17/5068 |
| | | | | 716/113 |
| 10,595,378 B2* | 3/2020 | Li | ................... | H05B 45/385 |
| 2002/0047728 A1* | 4/2002 | Held | ................... | H01L 22/00 |
| | | | | 327/39 |
| 2009/0237385 A1* | 9/2009 | Lee | ................... | G09G 5/003 |
| | | | | 345/211 |
| 2010/0244983 A1* | 9/2010 | Allen | ................... | H03H 7/06 |
| | | | | 333/168 |
| 2015/0260759 A1* | 9/2015 | Ramirez | ................ | G01R 11/24 |
| | | | | 340/870.09 |
| 2017/0041692 A1* | 2/2017 | Watson | ................... | H04R 1/023 |
| 2018/0054119 A1* | 2/2018 | Cho | ................... | H05K 3/303 |

FOREIGN PATENT DOCUMENTS

| | | |
|---|---|---|
| WO | 02096166 A1 | 11/2002 |
| WO | 2012084057 A1 | 6/2012 |

OTHER PUBLICATIONS

Examination Report under Section 18(3), UKIPO, Application No. GB1720085.8, dated May 1, 2020.

\* cited by examiner

MEMS PACKAGING

TECHNICAL FIELD

This application relates to a substrate for a transducer package and to methods and apparatus for packaging of a MEMS transducer. This application further relates to packages for or comprising a MEMS transducer, such as a MEMS microphone.

BACKGROUND INFORMATION

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, personal digital assistants (PDAs), various wearable devices, mobile computing platforms such as laptop computers or tablets and/or games devices.

In particular, MEMS transducers are increasingly being used in portable devices with communication capability, e.g. mobile telephones or the like. Such devices will include at least one antenna for transmitting and receiving RF signals. The amount of power transmitted by such devices can be relatively high and is set to increase with changes to the communication standards. This can cause a problem for MEMS transducers, such as microphones, with CMOS circuitry. The transmitted RF signals can be coupled to the CMOS circuitry and, as the CMOS circuitry is inherently non-linear, such signals may be demodulated to the audio band. This may therefore result in audible noise such as the so-called "bumblebee noise". This problem may be exacerbated when using MEMS microphones with integrated CMOS circuitry as in many devices the position of the antenna happens to be close to the position where the microphone is required.

As a result of this, the transducer and circuitry are often provided in a package which is at least partly shielded to prevent radiated RF from directly coupling to the CMOS circuitry, e.g. radiated RF noise. However it has been appreciated that, in use, conduction of RF noise into the transducer package and to the circuitry of the transducer die can occur via the electrical contacts of the transducer package which connect an output terminal of the transducer to one or more external components.

Filter circuits are therefore often also incorporated into the transducer package for filtering this conducted RF noise.

Typically, filter circuits used to filter the RF signals are low pass RC (resistor-capacitor) filter circuits. Such filter circuits may be provided e.g. between an output/input terminal of the transducer circuitry and external contact of the transducer package. In some arrangements the filter circuit may be implemented within the transducer package itself—for example formed of one or more conductive metal regions provided within the substrate and/or side walls of the package, or of the CMOS circuitry. However, passive components used in these filters potentially give rise to a number of problems which may affect the performance of the transducer. For example, filter circuits may themselves become a source of noise. In some arrangements heat generated by the filter circuit—for example by the resistor of a filter circuit—can be transferred into the chamber of the package and potentially into the cavities of the transducer, and this heat may also undermine the transducer performance.

Arrangements described herein seek to mitigate some of the problems associated with known filter circuit designs and implementation.

Summary of Embodiments

According to an aspect of the present invention there is provided a package for a MEMS device, the package comprising:

a MEMS transducer within a chamber of the package; and a package substrate, wherein an upper surface of the package substrate defines at least part of a surface of the chamber; wherein the package substrate comprises a plurality of metal layers, the package substrate further comprising at least a part of a filter circuit for filtering RF signals, wherein a first metal layer is provided in a first plane of the substrate and wherein a resistor of the filter circuit is provided in a plane below the first plane.

Thus, the resistor is no longer provided in a top metal layer (relative to the upper surface of the package substrate which forms at least part of an inner surface of the chamber). Therefore, heat generated by the resistor in use is less likely to be transferred to the chamber of the transducer package and, thus, the problems associated with such heat transfer, such as noise, are alleviated.

The chamber of the package may be considered to have an inner surface which at least partly defines a volume within the transducer package. The chamber may comprise electronic circuitry instead of or in addition to the MEMS transducer. The chamber of the package may be substantially enclosed.

The first plane may be considered to be a plane parallel to the upper or lower surface of the package substrate. Thus, the first plane may be a horizontal plane of the package substrate. Each layer of the package substrate may be provided in a different plane substantially parallel to the first plane.

The resistor may be formed by a second metal layer. The resistor may be formed by patterning the second metal layer.

The filter circuit may comprise the resistor and a first capacitor. The filter circuit may be provided at least partly within the package substrate.

The filter circuit may comprise a second capacitor. The first capacitor may be electrically connected between an input of the filter circuit and the resistor, and the second capacitor may be electrically connected between the resistor and an output of the filter circuit. Each capacitor may be electrically connected between a node of the filter circuit and a ground terminal.

Thus, a second order low pass filter circuit is provided which will cause high frequencies to be attenuated more steeply. Furthermore, the self-resonant frequency of each capacitor can be moved further from frequencies of interest due to this configuration.

An inductor may be connected in parallel with the resistor. The inductor may be positioned at least partly externally to the package. The inductor may be positioned within the exterior of the package.

Thus, voltage drop across the supply voltage may be reduced, and the current supplied to the device may not be limited.

The characteristics of the components may be selected so that the transition frequency of the resistor-inductor circuit lies above the audible frequency range and below a radio frequency of interest. The radio frequency of interest may be 850 MHz, 900 MHz, 1800 MHz or 1900 MHz. The audible frequency range may be between 20 Hz and 20 kHz.

According to another aspect of the present invention, there is provided a package for a MEMS device, the package comprising:
- a package substrate comprising an upper surface and a lower surface, the upper surface being at least partly in contact with a chamber of the package in use; wherein the package substrate comprises a filter circuit for filtering RF signals and wherein a resistor of the filter circuit is formed on, or within, a layer forming the lower surface of the package.

According to another aspect of the present invention, there is provided a package for a MEMS device comprising:
- a substrate comprising a plurality of layers, wherein a first layer of the substrate forms at least a part of an interior surface of a chamber of the package and wherein a second layer of the substrate forms at least a part of an exterior surface of the package,
- the package substrate comprising a resistor of a filter circuit, wherein the resistor is provided on or in the second layer.

According to another aspect of the present invention, there is provided a package for a MEMS device, the package comprising an RF filter circuit, wherein a resistor of the filter circuit is provided at, near or adjacent to an external surface of the package.

The resistor of the filter circuit may be provided externally to the package. The resistor may be provided within the exterior of the package. The resistor of the filter circuit may be provided within a layer forming at least part of an external surface of the package.

The MEMS transducer may comprise a microphone. The MEMS device may comprise readout circuitry. The MEMS transducer may be located within a package having a sound port. An electronic device may comprise the package for a MEMS device. The electronic device may be at least one of: a portable device; a battery powered device; an audio device; a computing device; a communications device; a personal media player; a mobile telephone; a games device; and a voice controlled device.

BRIEF DESCRIPTION OF THE DRAWINGS

For a better understanding of the present invention and to show how the same may be carried into effect, reference will now be made by way of example to the accompanying drawings in which:

FIG. 3b illustrates a cut through of a substrate of a package comprising the RF filter of FIG. 3a;

DETAILED DESCRIPTION

Throughout this description any features which are similar to features in other figures have been given the same reference numerals.

The drawings are for illustrative purposes only and are not to scale.

MEMS transducers, such as MEMS microphones, are typically provided within a package. The package effectively encloses the MEMS transducer and can provide environmental protection and may also provide shielding for electromagnetic interference (EMI) or the like. The package also provides at least one external connection for outputting the electrical signal to downstream circuitry. For microphones and the like the package will typically have a sound port to allow transmission of sound waves to/from the transducer within the package and the transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one of more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials due to temperature changes or the like).

Figure 1A:
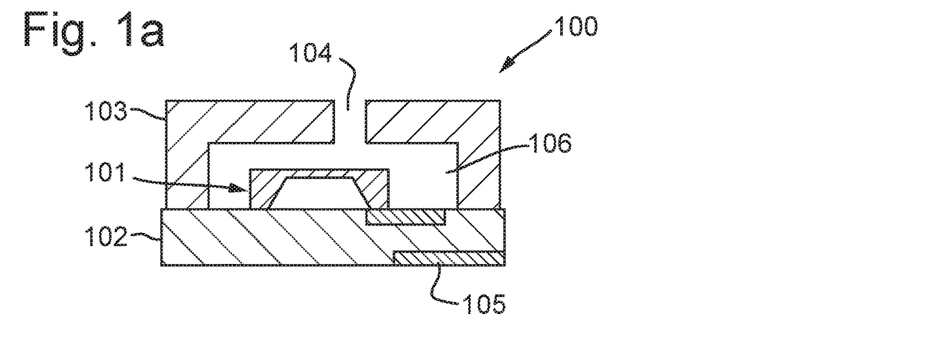
FIGS. 1a-d illustrate various configurations of a transducer package for a MEMS device.
Figure 1B:
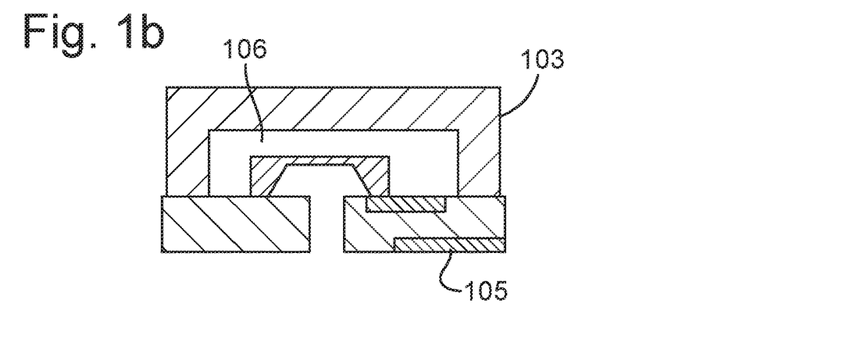

Various package designs are known. For example, FIGS. 1a and 1b illustrate "lid-type" packages 100. A MEMS transducer 101 is mounted to an upper surface of a package substrate 102. The package substrate 102 may be PCB (printed circuit board) or any other suitable material. A cover or "lid" 103 is located over the transducer 101 and is attached to the upper surface of the package substrate 102. The cover 103 may be a metallic lid. In FIG. 1a, an aperture 104 in the cover 103 provides a sound port and allows acoustic signals to enter the package. In FIG. 1b an aperture 104 in the substrate 102 provides the sound port and the MEMS transducer is mounted such that the flexible membrane of the transducer extends over the sound port.

Figure 1C:
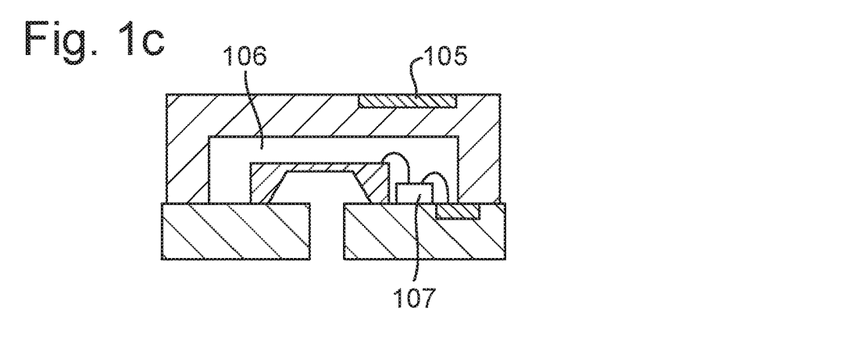
Figure 1D:
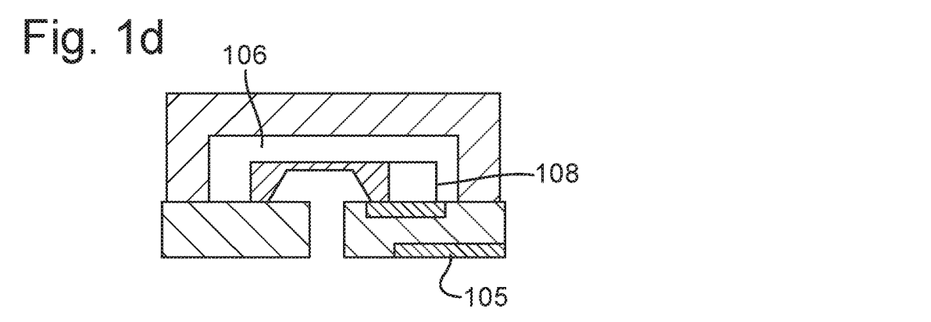

The package may also contain an integrated circuit as shown in FIGS. 1c and 1d. The integrated circuit will typically be formed on a die of semiconductor material and will be customised for a particular application. The integrated circuit will be electrically connected to electrodes of the transducer 101 and an electrically conductive path (not shown) is provided between the integrated circuit and an electrical connection provided on an external surface of the package. The integrated circuit may provide a bias voltage to the transducer and may buffer or amplify a signal from the transducer.

The package can be considered to comprise a cavity or void such that a space or chamber 106 is defined between the upper surface of the substrate 102 and the inner surface of the cover 103. The transducer 101 and the integrated circuit are typically provided within the chamber 106.

Although several different arrangements are known, according to the FIG. 1b arrangement a port hole 104 extends through the substrate 102 of the package. An external electrical connection 105, which may for example comprise solder pads or the like, is provided on the outer surface of the package substrate 102. According to convention, the configuration shown in FIG. 1b—in which the sound port is provided on the same side of the package to the external electrical connection—is known as a "bottom port" configuration. Conversely, an arrangement as shown in FIG. 1a in which the sound port is provided on a different side of the package to the external electrical connection is known as a "top port" configuration. It will be appreciated that the terms "bottom port" or "top port" do not imply any particular orientation of the package device either during manufacture, processing or any subsequent application.

In the bottom port arrangement of FIG. 1b, the transducer 101 is supported in a fixed relationship with respect to the package substrate 102 and is arranged such that the flexible membrane of the transducer extends over—or overlies—the acoustic port 104. The transducer is connected to an integrated circuit 107 (not shown) which is also supported by substrate.

FIGS. 1c and 1d show further alternative configurations of the MEMS transducer package. In the arrangement shown in FIG. 1c, which illustrates another top-port configuration, the electrical connection 105 is provided on the outer surface of the lid 103 whilst the transducer is provided relative to a port hole in the package substrate. In FIG. 1d—which illustrates a bottom port configuration similar to the configuration shown in FIG. 1b—the electrical connection 105 is provided on the same side as the sound port. It will be appreciated that the external electrical connection 105 could be provided anywhere on the exterior of the package. In FIG. 1c, an integrated circuit 107 or ASIC is provided on the substrate and is electrically connected to the MEMS transducer. An electrically conductive path (not shown) is provided between the integrated circuit and the electrical connection 105 provided on the outer surface of the lid 103. In the FIG. 1d configuration, the ASIC is integrated with the MEMS transducer die 108.

As will be appreciated by a person skilled in the art, various components of the MEMS package may be arranged using any combination of features illustrated by FIGS. 1a-1d. Furthermore, configurations are envisaged where components such as the transducer structure are provided on the top inner surface of the cover. The cover may not be one continuous piece of material as illustrated, and may instead be formed from different layers. For example, a portion of the lid may be formed from a substrate or PCB similar to that illustrated in any of FIGS. 1a-1d, or as described herein.

As previously mentioned, the MEMS device package may be provided in close proximity to an antenna, and hence RF radiation may be conducted into the internal components of the transducer device via electrical connections, such as bond pads, for connecting the CMOS circuitry with external components.

Figure 2:
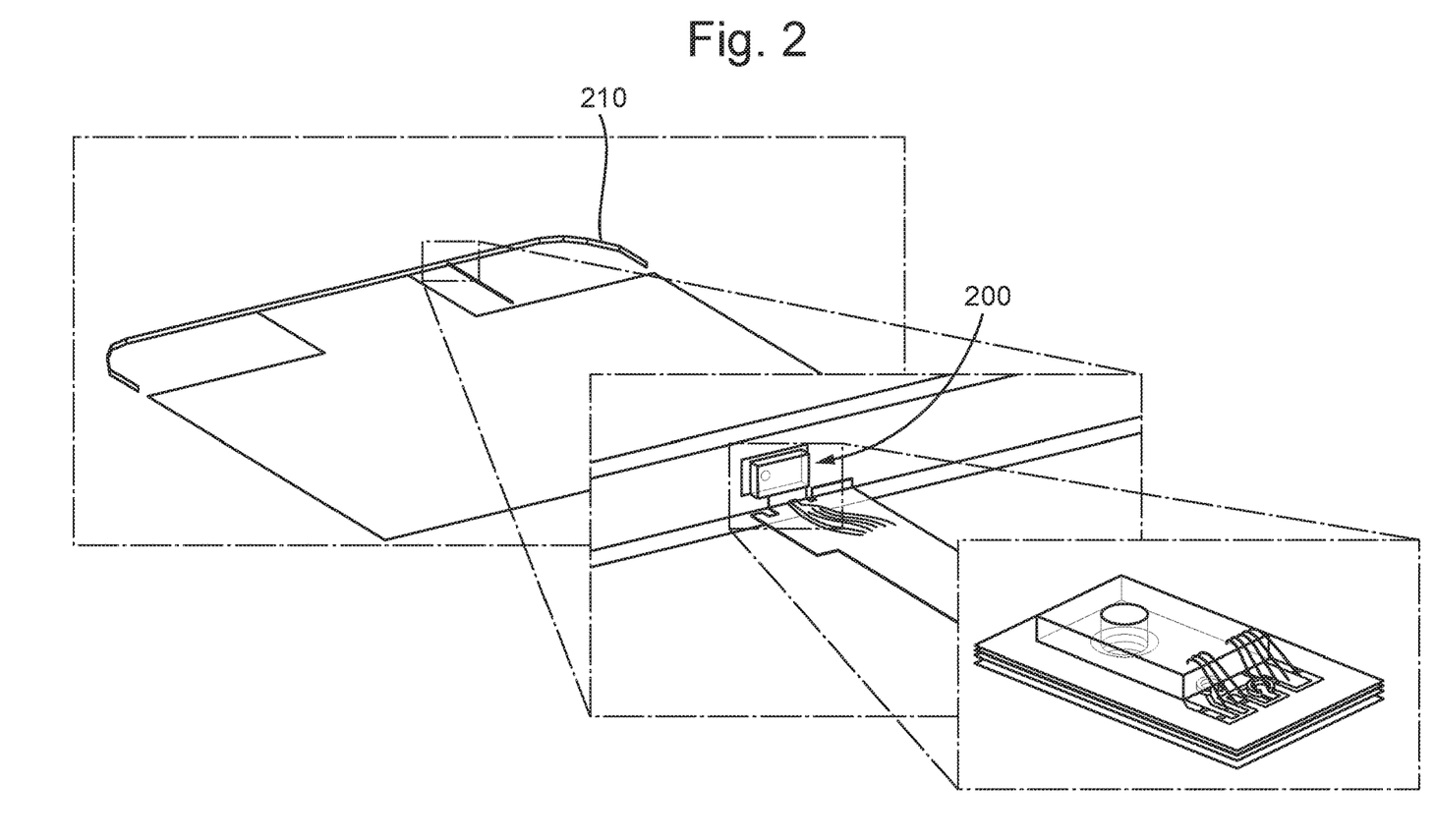
FIG. 2 illustrates an example arrangement of an antenna in relation to a transducer package for a MEMS device.

FIG. 2 illustrates an example of the relative arrangement of an antenna, in this case a GSM antenna 210, positioned adjacent to a MEMS package 200, for example in the case where the MEMS package is provided in a communication device. Communication devices utilising GSM antenna, such as mobile phones, often transmit RF signals a frequency of e.g. 900 MHz, and with characteristics which may allow the transmitted signal to be demodulated to an audible range if conducted into the transducer package. Thus, from consideration of FIG. 2 which illustrates the close proximity of the antenna 210 relative to the MEMS package 200, it will be appreciated that the RF signals transmitted and received by a mobile phone antenna may interfere with signals within the transducer structure, causing noise.

In order to filter one or more of the frequencies of an RF signal incident on a transducer package which may potentially give rise to noise if conducted into the internal components of the package, a filtering path may be provided. For example, a filter circuit may be provided on any conductive path which extends between an external contact of the package and electronic components or circuitry within the transducer package. The filter path or filter circuit may be provided outside the transducer package or may be at least partly provided as a part of the package. In some configurations, the filter path may be provided inside the transducer package and/or may, be provided in conjunction with electronic circuitry such the CMOS circuitry or ASIC.

One or more filter circuits may be located, for example, along any conductive path formed between the electronic components of the MEMS device such as the ASIC and any external electronic components. Thus, the frequencies of RF signals transmitted and received by the antenna of a communication device, which may potentially couple to the CMOS circuitry of the transducer device, are preferably at least partly filtered before they reach the CMOS circuitry. According to one or more examples, the filter circuity may be arranged to provide a filter for RF noise at frequencies of between 300MHz and 2000 MHz, more preferably at around 850 MHz and 900 MHz, or 1800 MHz and 1900 MHz.

Figure 3A:
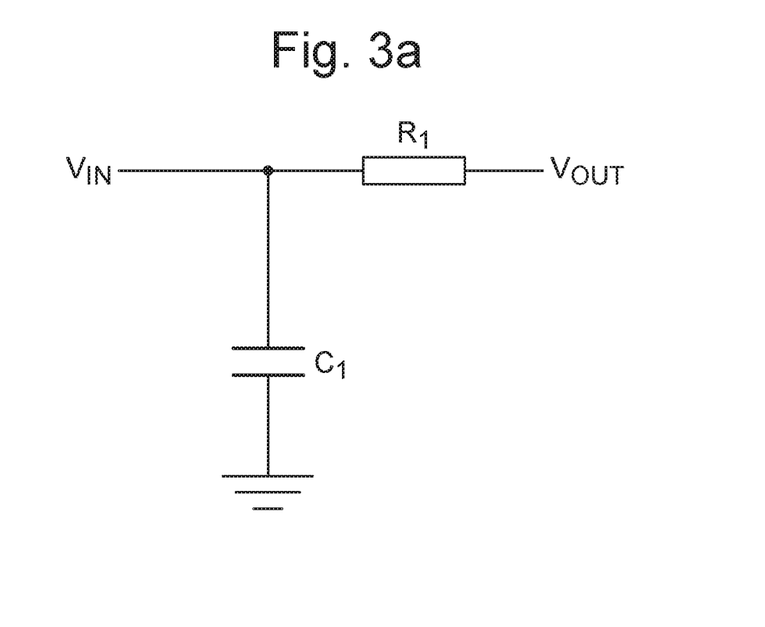
FIG. 3a illustrates a circuit diagram of an RF filter.

FIG. 3a illustrates the configuration of a filter circuit provided as part of a transducer package. The filter circuit of FIG. 3a comprises an input Vin and an output Vout on a signal path of an RF signal which has been conducted from one or more external electrical contacts of a transducer package towards electrical components or circuitry provided in the package or an electrode of the transducer. The filter circuit is thus typically located on a path between an external connection of the transducer package and integrated electronic circuitry provided within the package. In the FIG. 3a example, a resistor R1 is provided in series between the input Vin and output Vout of the filter circuit. A capacitor C1 is electrically connected to a node positioned between the input Vin of the filter circuit and the resistor R1, with one plate electrically connected to the node and the other plate electrically connected to a reference voltage terminal, for example ground. Thus, this circuit forms a first order RC low-pass filter for RF signals. As will be well known to those skilled in the art, in such a circuit, for low frequency input signals having low frequencies, the capacitive reactance is high, compared to the resistive value of the resistor, so that low frequency signals pass through the resistor. At higher frequencies, the capacitive reactance of the capacitor drops, and the capacitor, which is connected to ground, effectively functions as a short circuit. Thus, in an ideal system, only frequencies below a cutoff frequency pass through the filter.

According to one or more examples discussed herein, the circuit of FIG. 3a, or any filter circuit, may be formed at least partly within the substrate of a transducer package. The package substrate may comprise a plurality of layers of alternating dielectric material and conductive material, such as metal. Thus, the metal layers of the substrate may be patterned and electrically connected to one another in such a way so as to form the required filter circuit.

Figure 3B:
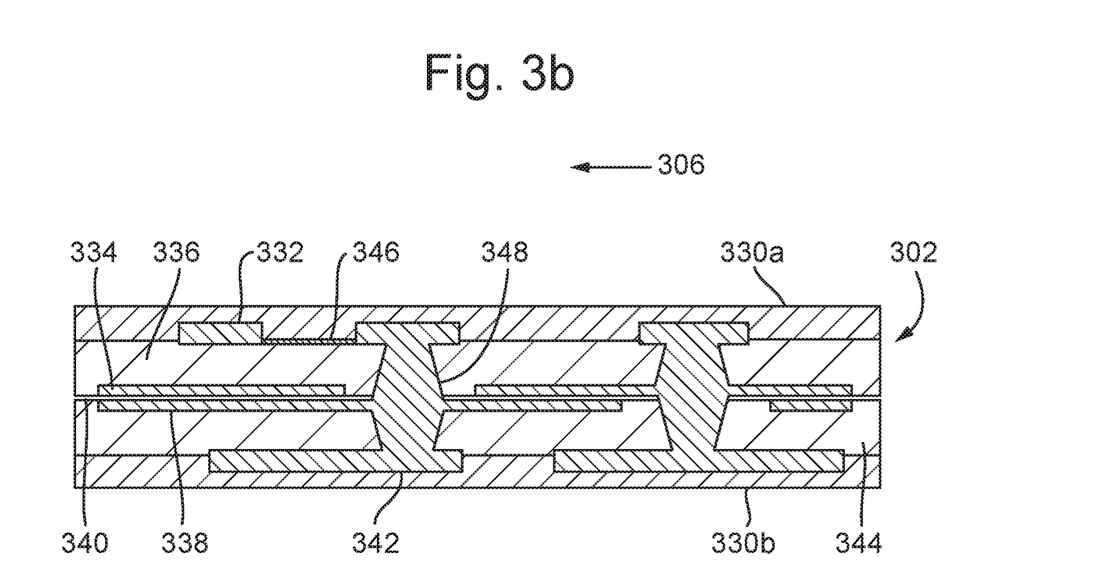

FIG. 3b illustrates a cut through of a portion of an example of a package substrate 302 comprising the filter circuit illustrated in FIG. 3a. The package substrate 302 shown in this example comprises a plurality of layers. Embedded within or provided on the layers of the package substrate are a plurality of conductive or metal layers. As illustrated in FIG. 3a, the upper layer of the substrate 330a forms an upper surface of the substrate which, in use, may be at least partly in contact with a cavity 306 of the transducer package. In this example, a first layer of solder resist forms the first or upper layer 330a of the package substrate. The package substrate further comprises first and third layers of dielectric material 336 and 338 and a second, or bottom, layer of solder resist 330b. A core 340 layer—or second layer of dielectric material—is disposed in between the plane of the first and third layers of dielectric material.

The package substrate 302 further comprises a first, or top, metal layer 332 which, in this example, is formed at least partly within the upper layer 330a of the substrate. The metal layer 332 forms at least a part of an interface for forming an electrical connection with other components of the MEMS device, such as the ASIC. The conductive material of the top metal layer 332 is also used to form a resistor 346 of the filter circuit, i.e. a component that is deliberately introduced to provide a desired resistance as part of a specific filter. A second metal layer 334 is positioned in a plane below the first metal layer 332, and is at least partly separated from the first metal layer 332 by the first layer of dielectric material 336. The dielectric material may be e.g., pre-preg (pre-impregnated composite fibres reinforced with a resin system). The second metal layer 334 is electrically connected to a conductive path (not shown) which extends to a ground terminal of the filter circuit, and thus forms a ground plane of the package substrate 302. A third metal layer 338 is positioned below the second metal layer 334 and is at least partly separated from the second metal layer 334 by the substrate core which may be considered to be a second layer of dielectric material 340 different to the first dielectric material. The third metal layer 338 is electrically connected so as to form a power plane of the package substrate 302. A part of the second metal layer 334 and a part of the third metal layer 338 which are arranged to define parallel conductive plates form a capacitor of the filter circuit, i.e. a component that is deliberately introduced to provide a desired capacitance as part of a specific filter. A fourth metal layer 342 is provided below the third metal layer 338. The fourth 342 layer is at least partly separated from the third metal layer 338 by the third dielectric layer 344. The fourth metal layer 342 is patterned to form at least part of the input/output pads for providing an electrical connection to one or more external circuits. These may, for example, be a land grid array (LGA) which provide contacts for surface mounting of the transducer package. The second layer of solder resist 330b is provided in a plane below the fourth metal layer 342, and at least partly covers the fourth metal layer 342.

A portion of the fourth metal layer 342 which provides the external I/O connection for the transducer package is electrically connected, by a first via 348, or the like, through the third dielectric layer 344 of the package substrate 302, to the conductive plate formed in the third metal layer 338. Thus, a first conductive plate of the first capacitor C1 of the filter circuit shown in FIG. 3b is formed from a portion of the third metal layer 338. A second conductive plate of the first capacitor C1 is formed from a portion of the second metal layer 334 which is connected to ground, and separated from the third metal layer 338 by the second layer of dielectric 340. The third metal layer 338 is also electrically connected by the first via 348 to the first metal layer 332. A resistor 346, shown in FIG. 3a as R1, is formed in the first metal layer 332 between the first via 348 and an interface for electrical connection to the transducer circuitry. Thus, the components and connections as shown in the circuit of FIG. 3b are achieved i.e. implemented within the package substrate.

In the arrangement illustrated in FIG. 3a, the resistor is provided by the material that forms the first (top or upper), layer of metal 332, this metal layer being provided at or near the top plane of the transducer substrate i.e. the plane of the package substrate that is at least partly in contact with the chamber of the package in use.

It will of course be appreciated that a layer of the substrate which forms a component of the filter circuit may have been patterned to be discontinuous. As use herein the term layer therefore refers to any instances of the same material that was deposited or formed at the same time and thus appears in the same order in the stack of materials at different places.

Furthermore, it will be appreciated that metal interconnects for instance may be associated with a parasitic capacitance or inductance. In embodiments of the present invention however the relevant metal layer is patterned to form part of a resistive, capacitive or inductive component that provides more than simply parasitic capacitance or inductance.

Figure 4A:
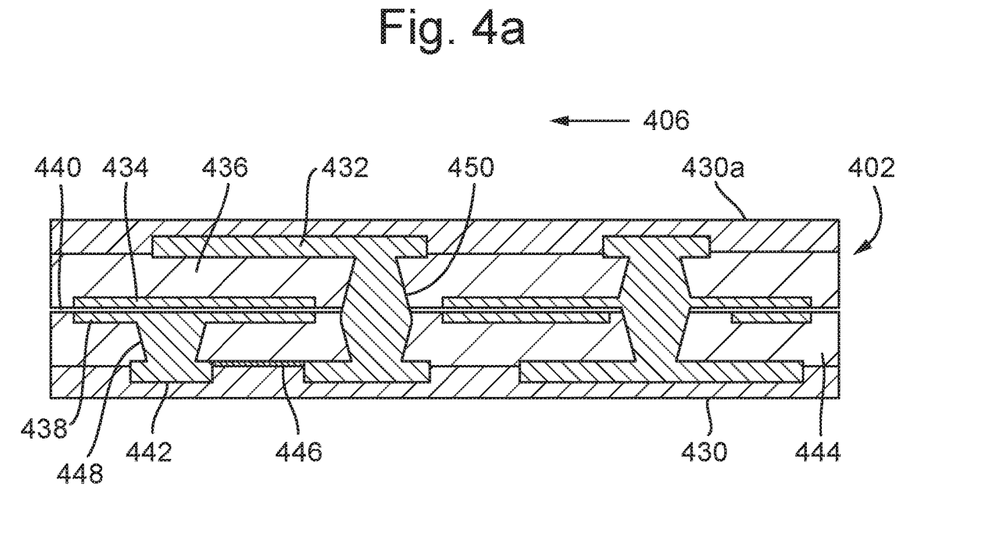
FIG. 4a illustrates a cut through of a substrate of a package comprising the RF filter of FIG. 3a according to an example embodiment.

FIG. 4a illustrates a cut through of a portion of the package substrate of a transducer package comprising a filter circuit according to an example embodiment. In the example embodiment illustrated in FIG. 4a, the conductive layers of the substrate are patterned and electrically connected so as to form the circuit illustrated in FIG. 3a. Thus, in this embodiment, a passive resistor-capacitor (RC) filter circuit is formed in the package substrate.

The package substrate 402 shown in FIG. 4a comprises an upper, or first, layer 430a. It is intended that the upper layer of the substrate will format least part of a surface (inner surface) of a chamber 406 of a transducer package in use. In the orientation illustrated in FIG. 4a, the chamber is illustrated as being above the surface of layer 430a of the package substrate 402. However, it will be appreciated that the package substrate may be oriented differently in use or during fabrication, e.g. so that the chamber extends in a direction below the "top" surface of layer 430a. Thus, the relative terms "upper", "lower", "top", "bottom" etc. should be interpreted accordingly. The chamber 406 may comprise, for example, a volume of air, or a vacuum. The electrical circuitry for the MEMS device and alternatively or additionally the transducer may also be at least partly in contact with the chamber 406 of the transducer package.

In the example embodiment of FIG. 4a, the upper layer 430a of the package substrate 402 (which comprises the upper surface of the package substrate) comprises a layer of solder resist. It should be appreciated that the upper layer of the package substrate may be formed of any appropriate dielectric material. The package substrate further comprises a first, or top, metal layer 432. The first metal layer 432 forms at least a part of an interface for forming an electrical connection with other components of the MEMS device, such as the ASIC. A second metal layer 434 is positioned in a plane below the first metal layer 432. The first 432 and second 434 metal layers are at least partially separated by a first layer of dielectric material 436, for example, pre-preg. The second metal layer 434 may be electrically connected to a conductive path to a ground terminal, thus forming a ground plane of the package substrate. A third metal layer 438 is positioned below the second metal layer 434 and is at least partly separated from the second metal layer 434 by a second layer of dielectric material 440, which may be a different material from the first layer of dielectric material 436, i.e. at least party formed from PCB core. The third metal layer 438 is electrically connected to so as to form a power plane of the substrate 402. Thus, the second and third metal layers 434, 438 are arranged so as to define parallel conductive plates which form a capacitor C1 of the filter circuit, i.e. a component that is deliberately introduced to provide a desired capacitance as part of a specific filter. A fourth metal layer 442 is provided below the third metal layer 438 and is at least partly separated from the third metal layer 438 by a third layer of dielectric material 444, i.e. pre-preg. The fourth metal layer 442 is patterned to form at least part of the input/output pads for external electrical connection to circuits external to the transducer package (i.e. a land grid array which may provide contacts for surface mounting of the package). The fourth metal layer is also patterned to form a resistor 446. The resistor 446 may be formed by simply patterning the metal to form a relatively long conductive path. This may be achieved for instance by forming a serpentine path, i.e. a winding path. A second layer of solder resist 430b is provided below the fourth metal layer, and at least partly covers the fourth metal layer.

The fourth metal layer 442 which provides the external I/O connection for the transducer package is electrically connected, by a first via 448 or metal interconnect, through the through the third dielectric layer 444 of the package substrate 402, to the conductive plate formed in the third metal layer 438. A first conductive plate of the first capacitor C1 of the filter circuit shown in FIG. 4a is formed from a portion of the third metal layer 438. A second conductive plate of the first capacitor C1 is formed from a portion of the second metal layer 434 which is connected to ground, and separated from the third metal layer 438 by the second layer of dielectric 440. A resistor 446, which corresponds to resistor R1 illustrated in FIG. 3a, is provided by the conductive metal material of the fourth metal layer, and is electrically connected between the first via 448 and a second via 450. The fourth metal layer 442 is also connected by the second via 450, or metal interconnect, to the first metal layer 432. An interface for electrical connection to the transducer circuitry is also provided within the first metal layer 432. Thus, the components and connections as shown in the circuit of FIG. 3a are formed within the package substrate, where the resistor is provided in the fourth (bottom or lower), layer of metal 442.

An advantage provided by this example embodiment is that the resistor is positioned away from the upper surface of the package substrate—or in a plane that is spaced from the plane of the upper surface of the substrate. As a consequence of the resistor being located within a layer of the package substrate other than the top layer, it will be appreciated that the resistor is provided further from a chamber of the transducer package which will contain the transducer and/or electronic circuitry of the transducer. Furthermore, one or more layers of dielectric material and/or metal material will be provided between the resistor and the top surface of the package substrate which is open to the chamber, and these layers will advantageously act to absorb at least some of the heat generated by the resistor. Thus, heat generated by the resistor in use is less likely to be transferred to the chamber of the transducer package. Furthermore, heat generated by the filter circuit, in particular by the resistor of the filter circuit, is less likely to disrupt or undermine the performance and/or the functioning of the transducer (e.g. by heating air in the back volume of a transducer) when positioned in a layer, or plane, that is below an upper metal layer of the substrate. Package substrate designs according to one or more of the present examples benefit from providing a degree of thermal insulation to the interior of the transducer package from the passive components of a filter circuit which are implemented within the package substrate. Consequently, the transducer is less likely to suffer from noise caused by the filter circuit.

Figure 4B:
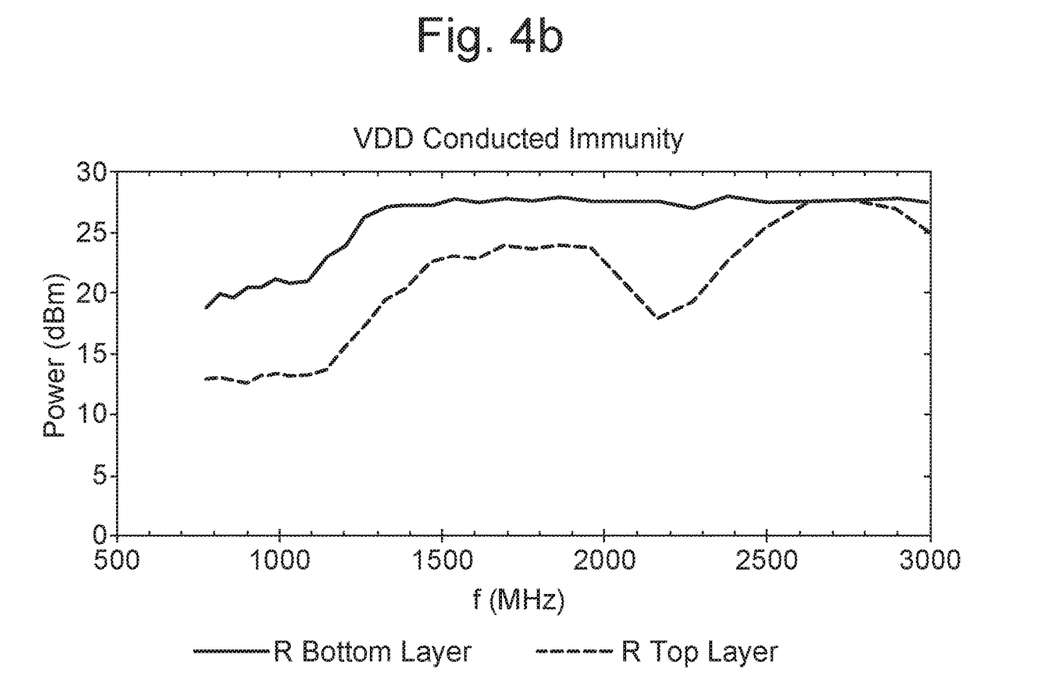
FIG. 4b illustrates the behaviour of a supply voltage in terms of frequency vs power due to a filter circuit according to an example embodiment.

Furthermore, as is shown in FIG. 4b, in the case of a configuration in which the resistor is formed in a metal layer below the first metal layer of the substrate, rather than in a layer proximate to a cavity of the transducer package, the total RF power required to reach an immunity threshold is significantly higher. This is because the heat dissipated in the resistor is isolated from the chamber of the transducer package, preventing the thermo-acoustical coupling effects. Thus, the power supply rejection (PSR) of the microphone is improved.

It will be appreciated by the skilled person that any configuration in which the resistor is provided in a plane that is spaced further from the upper surface of the package substrate will reduce the heating of the cavity and improve PSR. Thus, the resistor may be preferably positioned in any layer below the top layer (or top metal layer) of the substrate. For example, the resistor may be provided in a plane below a plane comprising a first, or upper, metal layer. It will be appreciated that the substrate layers may be patterned and electrically connected to produce the appropriate filter circuit based on the position of the resistor.

The substrates as described herein comprises four metal layers for purposes of illustrating the invention, however, it is envisaged that the substrate may comprise any number of layers, and the layers may be formed of any number of different materials. The circuits described herein may be formed in any appropriate layers of the package substrate, provided that appropriate electrical routing techniques are used to connect the components of the circuits. The skilled person will be aware of other arrangements that may be used.

Figure 5A:
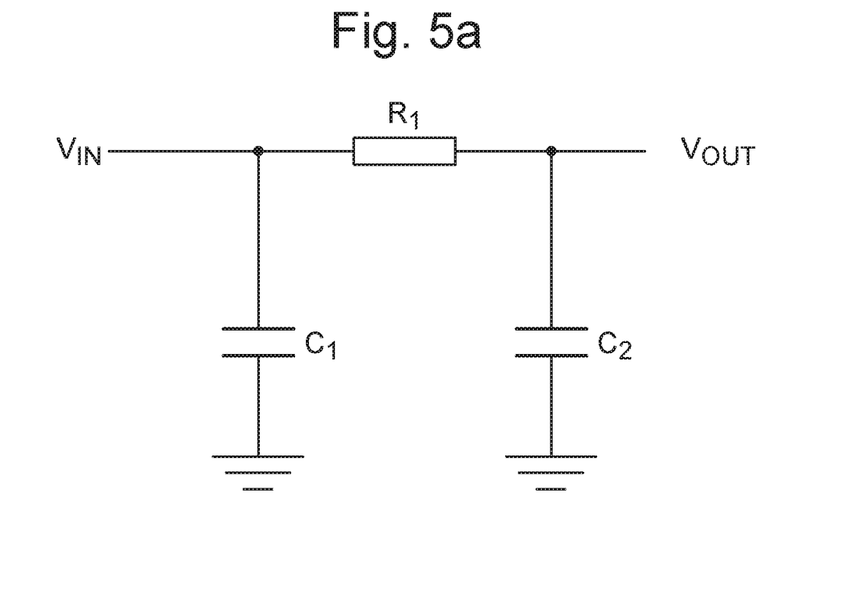
FIG. 5a illustrates a circuit diagram for an RF filter according to a further example embodiment.

FIG. 5a illustrates the components of an RF filter circuit provided as part of a transducer package according to another example embodiment of the present invention. In the example shown in FIG. 5a, the filter circuitry comprises a capacitive-resistive-capacitive (CRC) filter circuit located on a path between an external connection of the transducer package and the integrated electronic circuitry. The CRC filter is provided in the path of an RF signal which has been conducted from one or more external electrical contacts of a transducer package towards the electrical components of a transducer provided within the package. The CRC filter circuit comprises a resistor R1 connected in series between an input Vin from an external connection of the transducer package and an output Vout to the integrated electronic circuitry of the transducer package. A node of the first capacitor is positioned between the input of the filter circuit and the resistor R1. A first conductive plate of a capacitor C1 is electrically connected to the node positioned between the input Vin of the filter circuit and the resistor R1, and the second plate is electrically connected to a ground terminal. A second capacitor C2 is provided in the same manner as the first capacitor, except that the node of the second capacitor is provided between the resistor and the output of the filter circuit. It will be appreciated that FIG. 5a illustrates the circuit connections and does not represent the actual physical layout of the components.

In this example embodiment, each of the first and second capacitors are electrically connected to a ground terminal. However, it will be appreciated by a person skilled in the art that a capacitor plate which in this example is connected to ground may instead be biased to any voltage different to that of an opposing plate of the same capacitor. Additionally, each capacitor plate shown as connected to ground in this example may be biased to different reference voltages.

Figure 5B:
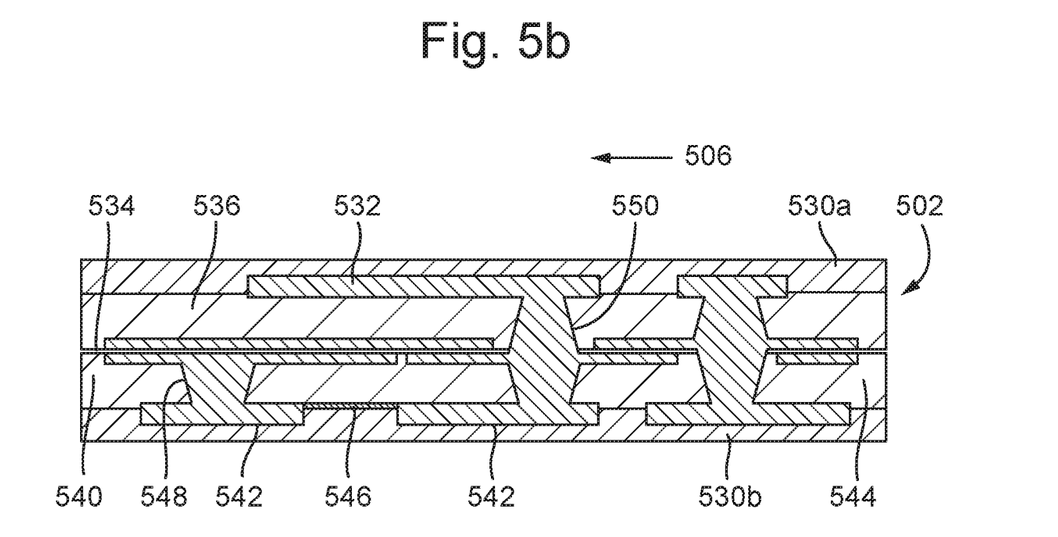
FIG. 5b illustrates a cut through of a substrate of a package comprising the RF filter of FIG. 5a according to a further example embodiment.

FIG. 5b illustrates an example embodiment of a part of a package substrate implementing the circuitry illustrated in FIG. 5a. The example illustrated in FIG. 5b differs from that illustrated in FIG. 4b in that the second metal layer 534 and the third metal layer 538 are patterned to form two capacitors of the filter circuit. The electrical connections between the layers of the package substrate therefore also differ from the example of FIG. 4b in order to form the circuit illustrated in FIG. 5a.

A fourth metal layer 542 of the package substrate illustrated in FIG. 5b which provides the external I/O connection for the transducer package is electrically connected, by a first via 548 or metal interconnect, through the third dielectric layer 544 of the package substrate 502, to a capacitor plate formed in the third metal layer 538. A first plate of the first capacitor C1 of the filter circuit shown in FIG. 5a is formed from a portion of the third metal layer 538. A second capacitor plate of the first capacitor C1 is formed from a portion of the second metal layer 534 which is connected to ground, and is separated from the third metal layer 538 by the second layer of dielectric 540. A resistor 546, which corresponds to resistor R1 illustrated in FIG. 5a, is formed within the bottom layer of the package substrate 530b and is formed by the conductive metal that is deposited to form the fourth metal layer. The resistor 546 is electrically connected between the first via 548 and a second via 550. The fourth metal layer 542 is also connected by the second via 550, or metal interconnect, to the third metal layer 538. A first conductive plate of the second capacitor C2 of the filter circuit shown in FIG. 5a is formed from a portion of the third metal layer 538. A second conductive plate of the second capacitor C2 is formed from a portion of the second metal layer which is connected to ground, and separated from the third metal layer 538 by the second layer of dielectric 540. The plates of the capacitors C1 and C2 are also separated e.g. spaced laterally within the plane of the package substrate from one another. The portion of the third metal layer 538 which forms the first conductive plate of the second capacitor C2 is also connected to the first metal layer 532 by the second via 550. An interface for electrical connection to the transducer circuitry is also provided within the first metal layer 532. Thus, the components and connections as shown in the circuit of FIG. 5a are formed within the package substrate, where the resistor is provided in the fourth (bottom or lower), layer of metal 542, and two capacitors are provided, forming a second order filter circuit.

This example embodiment provides the advantages associated with the resistor being provided further from a chamber of the transducer package. Further advantages are also provided by the addition of a second capacitor in the manner described above. For example, the low pass filter (LPF) circuit provided in this example can be considered to be a second order LPF circuit due to the addition of a second capacitor which will cause high frequencies to be attenuated more steeply. The addition of a secondary capacitor in parallel with the first capacitor as shown in the example above also allows the total capacitance to be split into two smaller capacitances. Decreasing the size of the capacitors will move the self-resonant frequency of each capacitor further from frequencies of interest and reduce the equivalent series inductance of the circuit.

Figure 6A:
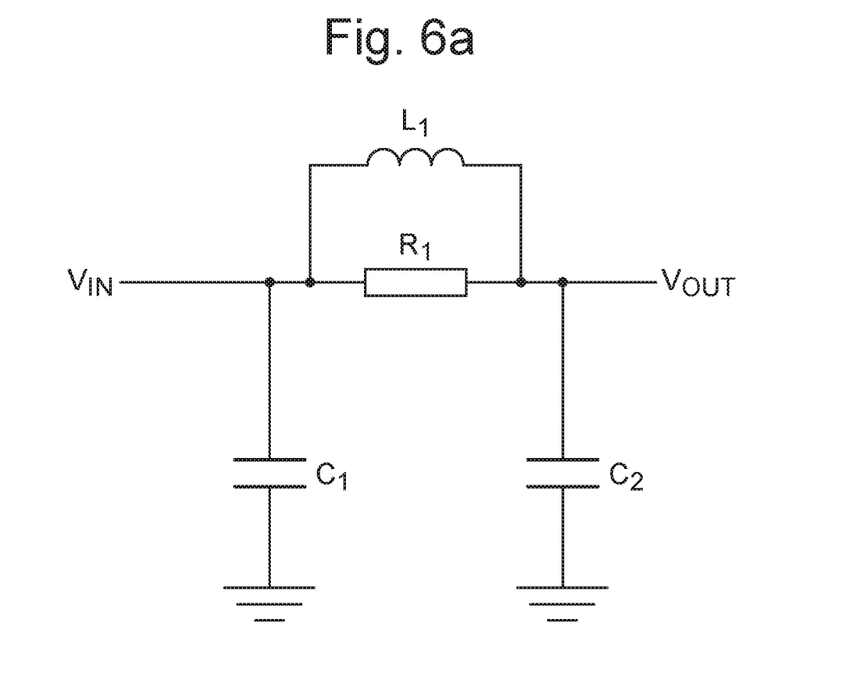
FIG. 6a illustrates a circuit diagram for an RF filter according to a further example embodiment.

FIG. 6a illustrates a filter circuit according to a further example embodiment. This embodiment differs from the filter circuit illustrated in FIG. 5a in that the circuit further comprises an inductor L1 electrically connected in parallel with the resistor R1.

Figure 6B:
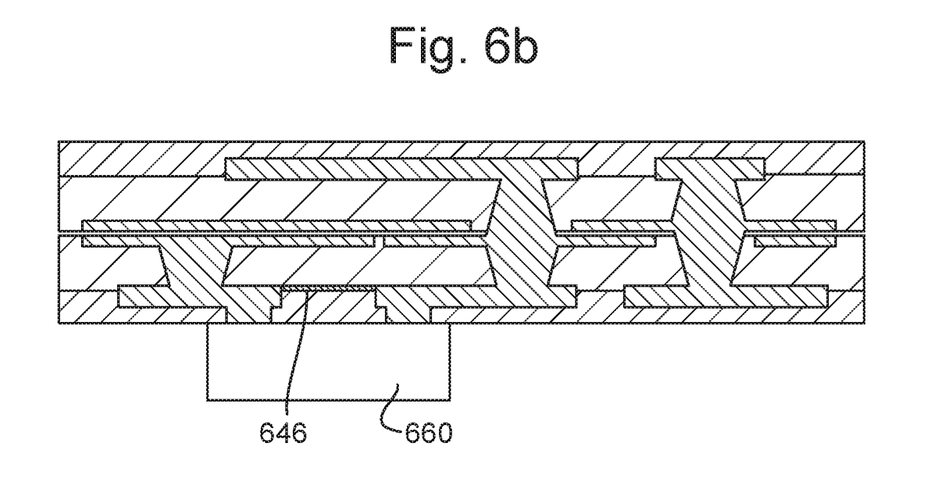
FIG. 6b illustrates a cut through of a substrate of a package comprising the RF filter of FIG. 6a according to a further example embodiment.

FIG. 6b shows an example of such a circuit implemented within the package substrate, but with the inductor 660 provided as an external component on the lower surface of the package substrate. Metal interconnects are provided on either side of the resistor 646 in the fourth metal layer 642. A first metal interconnect is provided between the input/output for connection to external circuits and the resistor 646. A second metal interconnect is provided between the resistor and the second via 650. An inductor 660 is provided between the first and second metal interconnects, thus forming a connection in parallel with the resistor 646.

In this example, the inductor is positioned externally to the package substrate, on an external surface of the package substrate, however, it should be appreciated that the inductor could be formed within the package substrate. For example, the inductor could be patterned within a metal layer of the substrate.

The inductor value may be selected such that the transition frequency (−3 dB point) of the inductor-resistor circuit lies above the audible frequency range (20 Hz and 20 kHz), but below an RF range of interest (in this case, 850 MHz/900 MHz or 1800 MHz/1900 MHz). For example, if the resistor is given a value of 25Ω and the value of the first capacitor is 50 pF, the value of the inductor may be selected to lie between the values of 30 nH and 300 nH.

The position of the resistor allows an inductor placed in parallel to be provided externally to the transducer package. The advantages associated with this arrangement are that the voltage drop across the supply voltage may be reduced, and the current supplied to the device may not be limited. For example, at low or DC frequencies, the impedance will decrease so the low frequency supply current may not be impeded, but high frequency currents may be significantly attenuated.

It should be understood that the relative terms "upper", "lower", "top", "bottom", "below", "underlying", "above", "overlying" etc. should not be in any way construed as limiting to any particular orientation of the transducer in use and/or during any fabrication step and/or the orientation in the package, or indeed the orientation of the package in any apparatus. The relative terms shall be construed accordingly.

It should also be noted that the terms front and back-volume do not denote any particular type of transducer construction or orientation of the transducer. In particular for a MEMS capacitive transducer having a flexible membrane, the flexible membrane will typically support a first electrode relative to a second, substantially fixed, electrode. The second electrode may be supported by a support structure, which is separated from the flexible membrane by a transducer cavity or gap. The support structure supporting the second electrode is sometimes referred to as a back-plate and is typically designed to have a relatively low acoustic impedance at the frequencies of interest. In some designs of transducer the back-plate may be located above the membrane (when fabricated on the substrate) and thus the cavity 205 in the substrate extends beneath the membrane. In other designs however a back-plate may be located under the membrane and the cavity 205 in the die substrate may therefore extend through the die substrate to the membrane.

Such a support structure, or back-plate, may therefore be located in the front volume or in the back volume.

The cavity 205 in the substrate may be formed in any known way. Advantageously the cavity may have a cross sectional area that increases towards the lower side of the substrate. Thus, the cavity immediately underlying the transducer may have a first cross sectional area so that the area of the membrane is defined accurately. Towards the lower side of the die substrate the cross sectional area of the cavity may be larger so as to maximise the part of the back volume provided by the cavity. In some embodiments there may be a step change in the slope profile of the walls of the cavity. Such a cavity profile may be achieved by a multi-stage etching process such as described in the patent GB2451909.

Embodiments of the present invention are particularly applicable to MEMS sensor transducers, especially capacitive transducers such as MEMS microphones. It will also be appreciated that other types of MEMS capacitive sensors could be implemented, for example accelerometers, pressure sensors, proximity sensors or flow meters.

Embodiments may be implemented in a host device, especially a portable and/or battery powered host device such as a mobile telephone, and audio player, a video player, a PDA, a mobile computing platform such as a laptop computer or tablet and/or a games device for example or in an accessory device, such a headset, earbud (possibly noise-cancelling), or microphone assembly, designed for wired, or wireless connection with such host devices, possibly via multi-wire cables, multi-pole jacks, or optical fibres and connectors.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A package for a MEMS device, the package comprising:
   a MEMS transducer within a chamber of the package; and
   a package substrate, wherein an upper surface of the package substrate defines at least part of a surface of the chamber; wherein
   the package substrate comprises a plurality of metal layers, the package substrate further comprising at least a part of a filter circuit provided to filter RF signals, wherein the filter circuit comprises a resistor, a first capacitor and a second capacitor, and wherein each capacitor is electrically connected between a node of the filter circuit and a ground terminal; and
   wherein a first metal layer is provided in a first plane of the substrate and wherein the resistor of the filter circuit is provided in a plane below the first plane.

2. A package for a MEMS device as claimed in claim 1, wherein the resistor is formed by a second metal layer.

3. A package for a MEMS device as claimed in claim 2, wherein the resistor is formed by patterning the second metal layer.

4. A package for a MEMS device as claimed in claim 1, wherein the first capacitor is electrically connected between an input of the filter circuit and the resistor, and the second capacitor is electrically connected between the resistor and an output of the filter circuit.

5. A package for a MEMS device as claimed in claim 1, wherein an inductor is connected in parallel with the resistor.

6. A package for a MEMS device as claimed in claim 5, wherein the inductor is positioned at least partly externally to the package.

7. A package for a MEMS device as claimed in claim 5, wherein the inductor is positioned within the exterior of the package.

8. A package for a MEMS device as claimed in claim 5 wherein the characteristics of the inductor, resistor, first capacitor and second capacitor are selected so that the transition frequency of the resistor-inductor circuit lies above the audible frequency range and below a radio frequency of interest.

9. A package for a MEMS device as claimed in claim 8, wherein the radio frequency of interest is 850 MHz, 900 MHz, 1800 MHz or 1900 MHz.

10. A package for a MEMS device as claimed in claim 8, wherein the audible frequency range is between 20 Hz and 20 kHz.

11. A package for a MEMS device as claimed in claim 1, wherein the filter circuit is provided at least partly within the package substrate.

12. A package for a MEMS device as claimed in claim 1, wherein the chamber of the package is enclosed.

13. A package for a MEMS device as claimed in claim 1 wherein said MEMS transducer comprises a microphone.

14. An electronic device comprising a package for a MEMS device as claimed in claim 1.

15. An electronic device as claimed in claim 14 wherein said device is at least one of: a portable device; a battery powered device; an audio device; a computing device; a communications device; a personal media player; a mobile telephone; a games device; and a voice controlled device.

* * * * *